United States Patent [19]

Bishop et al.

[11] 4,158,207
[45] Jun. 12, 1979

[54] IRON-DOPED INDIUM PHOSPHIDE SEMICONDUCTOR LASER

[75] Inventors: Stephen G. Bishop; Bruce D. McCombe, both of Alexandria, Va.; Wulf H. Koschel, Frieburg, Fed. Rep. of Germany

[73] Assignee: The United States of America as represented by the Secretary of the Navy, Washington, D.C.

[21] Appl. No.: 890,872

[22] Filed: Mar. 27, 1978

[51] Int. Cl.² .............................................. H01S 33/19
[52] U.S. Cl. ........................................ 357/18; 357/63; 331/94.5 H
[58] Field of Search .................... 331/94.5 H; 357/18, 357/17, 63

[56] References Cited

U.S. PATENT DOCUMENTS 4,055,815 10/1977 Smith .............................. 331/94.5 H Primary Examiner—Martin H. Edlow
Attorney, Agent, or Firm—R. S. Sciascia; Philip Schneider; Melvin L. Crane

[57] ABSTRACT

An iron-doped indium phosphide or gallium arsenide semiconductor laser. The semiconductor material is doped when formed by uniformly distributing transition metal ions such as iron throughout the semiconductor. The concentration of the iron ions is from about $1 \times 10^{15}$ to about $1 \times 10^{18}$ ions per cubic centimeter, but is limited only by the solubility of iron indium phosphide or gallium arsenide. It has been determined that the greater the concentration of ions, the easier the laser emission is obtained. At liquid helium temperature, the iron-doped semiconductor laser will operate at a wavelength near 3 microns.

20 Claims, 2 Drawing Figures

IRON-DOPED INDIUM PHOSPHIDE SEMICONDUCTOR LASER

BACKGROUND OF THE INVENTION

This invention relates to lasers, more particularly, to semiconductor lasers which have been doped with a transition metal such as iron.

The operation of different types of lasers, such as gas, solid-state and semiconductor, is well known in the prior art. Each of these must be excited by some means of radiation or, in the case of some semiconductors, an electrical potential is required for operation. The prior-art lasers are pulsed or continuous and some operate at low temperature, room temperature, or high temperature. Semiconductor lasers may be excited by the application of an electrical current, by electron-beam bombardment, and by optical excitation such as by a laser or any other suitable light source.

Semiconductor lasers usually generate light with photon energy very nearly equal to the forbidden gap energy of the particular semiconductor compound or alloy of which the laser is constructed. Thus, to obtain light of a given photon energy one must construct a laser based on a semiconductor which has the specific value of the energy gap, for example, GaAs laser light at a wavelength of about 9100° A at room temperature. In order to obtain visible radiation it is necessary to alloy GaAs with the higher band gap energy semiconductor GaP; correspondingly, to shift the laser wavelength farther into the near infrared it is necessary to alloy GaAs with a narrow-gap semiconductor, such as InAs, or use the narrow-gap semiconductor itself as the laser material. In this manner, large numbers of semiconductor lasers have been produced with band gaps and photon energies ranging from the visible to the infrared spectral regions. However, each new wavelength requires a new compound or alloy and often the development of an entirely new production technology. Crystal growth procedures must be developed and perfected, doping techniques for type conversion, diode growth, epitaxial growth techniques, and contacting methods are some examples of the developmental efforts and costs that may be encountered in the development/production of new semiconductor lasers. In the face of these deterrents to the development of many laser wavelengths, commercial development has understandably been concentrated on the visible and very-near infrared spectral ranges which are vital to civilian application such as visible displays and fiber-optic communications. Much less effort has been devoted to development of semiconductor lasers for the near infrared and infrared spectral ranges of high atmospheric transparency such as from 2 microns to 3 microns.

SUMMARY OF THE INVENTION

An iron-doped III-V compound semiconductor laser operable in the 2 $\mu$m to 3 $\mu$m wavelength range. Crystalline GaAs or InP semiconductors are doped with iron or another transition metal during their formation such that the iron ions are uniformly dispersed throughout the semiconductor. The iron ions are excited so that the semiconductor emits light at an output wavelength which depends upon the characteristic excited state configuration of the iron ions. Such a structure is simple to produce since the iron ions are added during the growth of the semiconductor crystal. It has been determined that the iron ion concentration in InP may be as high as $2 \times 10^{17}$ iron ions per cubic centimeter.

DETAILED DESCRIPTION

Figure 1:
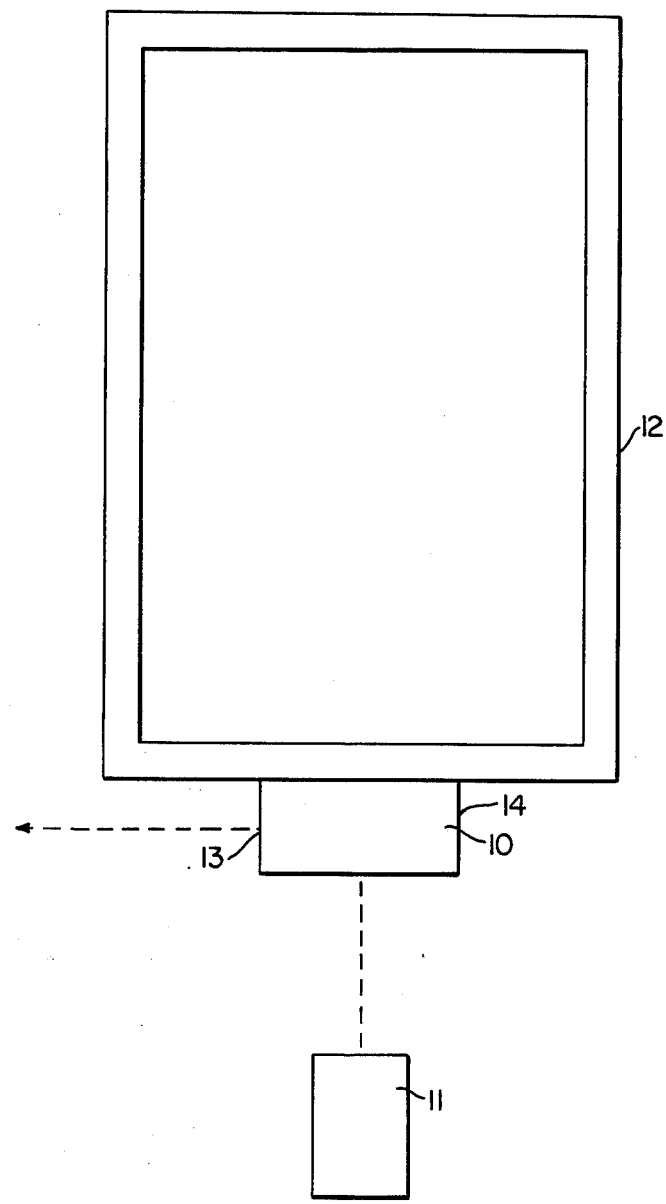
FIG. 1 is a schematic illustration of iron doped III-V compound semiconductor on a cold finger excited by laser radiation.

FIG. 1 shows the basic components of an iron-doped, III-V compound, semiconductor laser 10, such as a GaAs or InP laser, excited by raditaion of energy greater than the semiconductor band gap from a high-peak-power pulsed laser 11. For the purposes of discussion, an iron-doped InP semiconductor laser will be referred to throughout the specification. The iron-doped semiconductor is secured by one of the flat faces to the end of a cold finger Dewar 12 which is maintained at a temperature of about 4.2° K.

During production of the InP semiconductor, iron ions are added so that the concentration of iron ions is in the range of about $1 \times 10^{18}$ iron ions per cubic centimeter. Once the iron-doped InP crystal has been grown, the semiconductor laser element is formed. In forming the laser element, the crystal is cleaved along the (100) lattice plane which forms the face that is secured to the cold finger Dewar 12 and the face which receives the excitation radiation from the laser. Two of the opposing side faces 13 and 14 are cleaved perpendicular to the (100) lattice faces along the (110) lattice plane to form a Fabry-Perot resonator. The other two opposing side faces may be roughened to prevent laser emission in a direction perpendicular to the laser output between the two (110) lattice faces.

Figure 2:
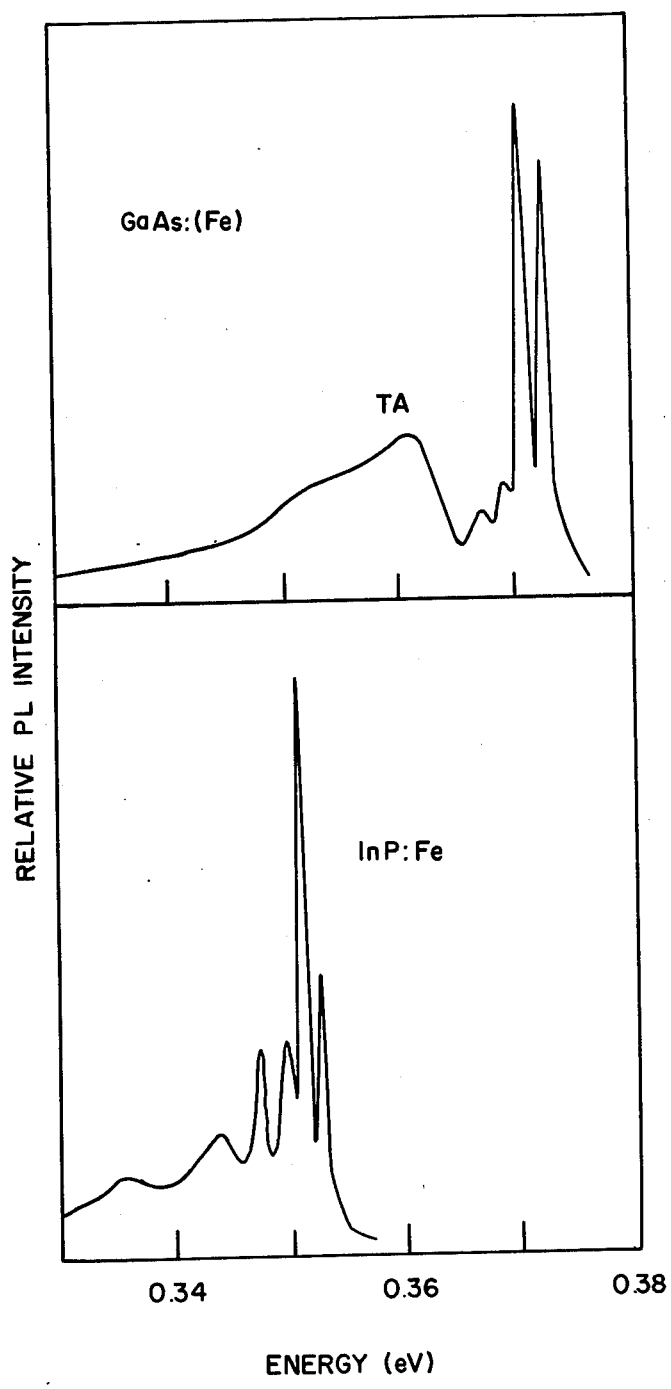
FIG. 2 are curves illustrating photoluminescent spectral distribution for GaAs:Fe and InP:Fe lasers.

In operation the semiconductor laser is secured to the face of the cold finger Dewar by any suitable means, such as solder, so that the faces forming the Fabry-Perot resonator are in the direction in which the output is to be directed. A high-peak-power laser having an output photon energy greater than the band gap irradiates the crystal to excite electronhole pairs therein. Some of these carriers then recombine with the emission of photons having energy very near that of the energy gap of the InP. However, since the semiconductor has been doped with iron ions the excitation also produces photons with energy less than half the band gap with a spectral distribution as shown in FIG. 2. This energy is characteristic of the optical transitions from excited states to the ground state of the iron ions in the InP lattice. In iron doped InP semiconductors, the optical tranistions are intracenter transitions between the $^5T_2$ and $^5E$ crystal field levels of $Fe^{2+}$ in tetrahedral coordination. For sufficiently high intensities of the exciting light, a population inversion will be produced in the excited state of the iron ions and stimulated emission of 0.35 eV light will occur. In the case of iron-doped GaAs, stimulated emission of 0.37 eV light will occur.

The operation above has been obtained using a Krypton gas laser with an output of 6471° A. Semiconductors of III-V compounds may be excited optically by a high energy electron beam, by injecting electron-hole pairs across a PN-junction, by injecting through PNP and NPN structures, by injection across heterojunction or Schottky barriers or by any other methods known in the art for injecting electron-hole pairs into semiconductors.

The addition of transition metal ions to III-V compounds to form semiconductors permits one to achieve laser action at wavelengths much longer than those obtainable by semiconductors of III-V compounds without transition metal ions. It has been determined that transition metals other than iron, such as chromium, cobalt, nickel and manganese may be added to semiconductors to obtain longer laser wavelengths than those characteristic of the band gap of the semiconductor. The output energy is determined primarily by the transition metal dopant and not by the energy gap of the host lattice alone. Thus, lasers formed as described above behave in a manner analogous to the behavior of rare earth dopants in insulating hosts where the laser wavelength is also determined by the energy levels of the dopant. The major difference between the doped semiconductor and the solid state lasers is that the solid state lasers can only be excited optically by high intensity radiation sources whereas transition metal-doped, semiconductors, III-V compounds can be excited by different means as set forth above.

The device has been described above as being optically excited. The iron-doped III-V semiconductor compound may be made as a PN junction and excited electrically as in prior art P-N junctions which are without iron doping. Furthermore an iron-doped semiconductor laser may be made in a hybrid construction in which a conventional heterostructure III-V semiconductor laser is grown on a suitable III-V compound, iron-doped-semiconductor substrate. The heterostructure laser is then excited electronically and the emitted radiation from the heterostructure optically excites the iron-doped, III-V compound, semiconductor substrate. It has also been demonstrated that the iron ion transition can be excited by the absorption of extrinsic light, that is, light with photon energy less than the band gap. This makes it possible to excite optically a larger volume of the semiconductor than can be excited by the strongly absorbed high energy interband light.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A light-emitting semiconductor device which provides a source of monochromatic, coherent light comprising:
    a III-V compound semiconductor,
    a transition metal dopant dispersed uniformly throughout said III-V compound semiconductor,
    said transition metal dopant allowing excitation of said III-V compound semiconductor to achieve laser action at wavelengths much longer than those not including said metallic dopant.

2. A light-emitting semiconductor device as claimed in claim 1 wherein:
    said transition dopant includes a metal selected from a group consisting of iron, chromium, cobalt, nickel and manganese.

3. A light-emitting semiconductor device as claimed in claim 1 wherein:
    said dopant is iron.

4. A light-emitting semiconductor device as claimed in claim 1, wherein:
    said III-V compound semiconductor is selected from the group consisting of InP and GaAs.

5. A light-emitting semiconductor device as claimed in claim 2, wherein:
    said III-V compound semiconductor is selected from the group consisting of InP and GaAs.

6. A light-emitting semiconductor device as claimed in claim 2 wherein:
    said III-V compound semiconductor is InP.

7. A light-emitting semiconductor device as claimed in claim 2 wherein:
    said III-V compound semiconductor is GaAs.

8. A light-emitting semiconductor device as claimed in claim 3 wherein:
    said III-V compound semiconductor is InP.

9. A light-emitting semiconductor device as claimed in claim 3 wherein:
    said III-V compound semiconductor is GaAs.

10. A light-emitting semiconductor device as claimed in claim 3 wherein:
    said iron dopant concentration dispersed uniformly throughout said semiconductor is as high as allowed by the solid solubility limit of iron in said semiconductor cubic centimeter.

11. A light-emitting semiconductor device as claimed in claim 8 wherein:
    said iron dopant distribution dispersed uniformly said semiconductor is as high as allowed by solid solubility limit of iron in said semiconductor per cubic centimeter.

12. A light-emitting semiconductor laser which provides an output energy of monochromatic coherent light comprising:
    a semiconductor material fabricated from a III-V compound semiconductor bulk material, and
    a transition metal dopant included within said III-V compound semiconductor material as the lasing material,
    said metal dopant being of the type which lases through the mechanism of intracenter luminescent transitions upon excitation by a suitable type of energy, thereby providing said coherent light.

13. A light-emitting semiconductor laser as claimed in claim 12 wherein:
    said metal transition dopant is dispersed uniformly throughout said III-V compound semiconductor material.

14. A light-emitting semiconductor laser as claimed in claim 12 wherein:
    said III-V compound bulk material is GaAs.

15. A light-emitting semiconductor device as claimed in claim 12, wherein:
    said III-V compound bulk material is InP.

16. A light-emitting semiconductor laser as claimed in claim 12 wherein:
    said metal dopant is iron.

17. A light-emitting semiconductor laser as claimed in claim 14 wherein:
    said metal dopant is iron.

18. A light-emitting semiconductor laser as claimed in claim 15 wherein:
    said metal dopant is iron.

19. A light-emitting semiconductor laser as claimed in claim 16 wherein:
    said iron dopant concentration in said semiconductor material is up to $1 \times 10^{18}$ iron ions per cubic centimeter.

20. A light-emitting semiconductor laser as claimed in claim 12 wherein:
    said semiconductor material is formed in a hybrid contruction in which a conventional heterostructure III-V semiconductor laser is formed on said transition-metal-doped III-V semiconductor material for excitation thereof.

* * * * *